United States Patent
Allen et al.

(10) Patent No.: US 8,710,896 B2
(45) Date of Patent: Apr. 29, 2014

(54) SAMPLING SWITCH CIRCUIT THAT USES CORRELATED LEVEL SHIFTING

(75) Inventors: Steven P. Allen, Chandler, AZ (US); Mohammad Nizam U. Kabir, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/484,304

(22) Filed: May 31, 2012

(65) Prior Publication Data

US 2013/0321059 A1    Dec. 5, 2013

(51) Int. Cl.
*H03L 5/00*            (2006.01)
*H03K 19/0185*    (2006.01)

(52) U.S. Cl.
CPC ............................. *H03K 19/018521* (2013.01)
USPC ......................................................... 327/333

(58) Field of Classification Search
USPC .................... 327/91–96, 333; 326/68, 80, 81; 365/189.11
See application file for complete search history.

(56) References Cited

U.S. PATENT DOCUMENTS

| | | | |
|---|---|---|---|
| 5,084,634 A | 1/1992 | Gorecki | |
| 5,170,075 A | 12/1992 | De Wit | |
| 5,500,612 A | 3/1996 | Sauer | |
| 6,060,937 A | 5/2000 | Singer et al. | |
| 6,118,326 A * | 9/2000 | Singer et al. | 327/390 |
| 7,176,742 B2 | 2/2007 | Aksin et al. | |
| 2003/0053569 A1 * | 3/2003 | Vilhonen | 375/345 |

OTHER PUBLICATIONS

Abo, et al., A 1.5-V, 10-bit, 14.3-MS/s CMOS Pipeline Analog-to-Digital Converter, IEEE Journal of Solid-State Circuits, May 1999, pp. 599-606, Vol. 34, No. 5.
Aksin et. al, Switchbootstrapping for Precise Sampling Beyond Supply Voltage, Aug. 2006, pp. 1938-1943, vol. 41, No. 8, IEEE Journal of Solid-State Circuits.
Cho, et al., A 10 b, 20 Msamplels, 35 mW Pipeline A/D Converter, IEEE Journal of Solid-State Circuits, March 1995, pp. 166-172, Vol. 30, No. 3.
Dessouky, et al., Input Switch Configuration Suitable for Rail-to-rail Operation of Switched Opamp Circuits, Electronics Letters, 7th Jan. 1999, pp. 8-10, vol. 35 No. 1.
Gregoire, et al., An Over-60 dB True Rail-to-Rail Performance Using Correlated Level Shifting and an Opamp With Only 30 dB Loop Gain, IEEE Journal of Solid-State Circuits, Dec. 2008, pp. 2620-2630, vol. 43, No. 12.

* cited by examiner

*Primary Examiner* — Lincoln Donovan
*Assistant Examiner* — Sibin Chen
(74) *Attorney, Agent, or Firm* — The Mason Group Patent Specialists LLC; Valerie M. Davis

(57) ABSTRACT

A sampling switch circuit uses correlated level shifting. The sampling switch circuit includes: a sampling switch having a first terminal, a control terminal, and an output terminal, wherein the first terminal is connected to an input voltage node; a boosting circuit connected to first and second supply voltage nodes and coupled to the control terminal of the sampling switch; and a correlated level shifting buffer circuit. The correlated level shifting buffer circuit includes: an amplifier having first and second inputs and an output, wherein the first input is connected to the input voltage node, and the output and second input are coupled to the boosting circuit; and a level shifting capacitor coupled to the second input and output of the amplifier, to the boosting circuit, and to a level shifting voltage node.

19 Claims, 3 Drawing Sheets

US 8,710,896 B2

SAMPLING SWITCH CIRCUIT THAT USES CORRELATED LEVEL SHIFTING

FIELD

The present disclosure relates generally to sample and hold circuitry and more particularly to a sampling switch circuit that uses correlated level shifting.

BACKGROUND

Sample and hold circuitry is used in signal processing applications such as analog-to-digital converters. One type of sample and hold circuit includes a sampling switch, which is implemented using at least one transistor, and a capacitor. More particularly, a time-varying (i.e., analog) input signal being sampled is periodically switched to the capacitor during a sampling interval to store a charge on the capacitor, which represents a magnitude (e.g., a voltage level) of the input signal being sampled. Between each of the sampling intervals is a hold interval during which the voltage level stored on the capacitor is provided to an input of an analog-to-digital converter (ADC) that generates an n-bit binary number proportional to the stored voltage level, thereby representing an approximation of the input signal at the time of the sample. A limitation of the sampling switch is that the transconductance of the transistor used to create the switch varies based on the magnitude of the input signal. This is because the difference between input and control terminals of the sampling switch transistor (e.g., Vgs, which is the voltage difference between the gate and source terminals of a field effect transistor) varies with the magnitude of the input signal. These changes in Vgs introduce changes in the sampling switch transconductance causing distortion in the sampled signal.

Techniques, such as the use of a boosting circuit, reduce or eliminate changes in the transconductance of the sampling switch by maintaining a constant Vgs across the sampling switch; this keeps the impedance across the sampling switch constant to eliminate distortion. A primary limitation of boosting circuits, however, is the signal strength needed to not only drive the input to the sampling switch but also to drive the boosting circuit. Buffer circuits introduced to drive the boosting circuits cause the boosting circuits to maintain a constant Vgs only for input signals that are within V_sat of a supply voltage rail (e.g., Vdd or Vss), in oversampled systems, wherein V_sat represents overhead of an amplifier within the buffer circuit, which could be several hundred milivolts. Transistor devices used to implement the amplifier require some amount of bias voltage across the terminals to sustain proper operation; this bias voltage creates the amplifier overhead.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
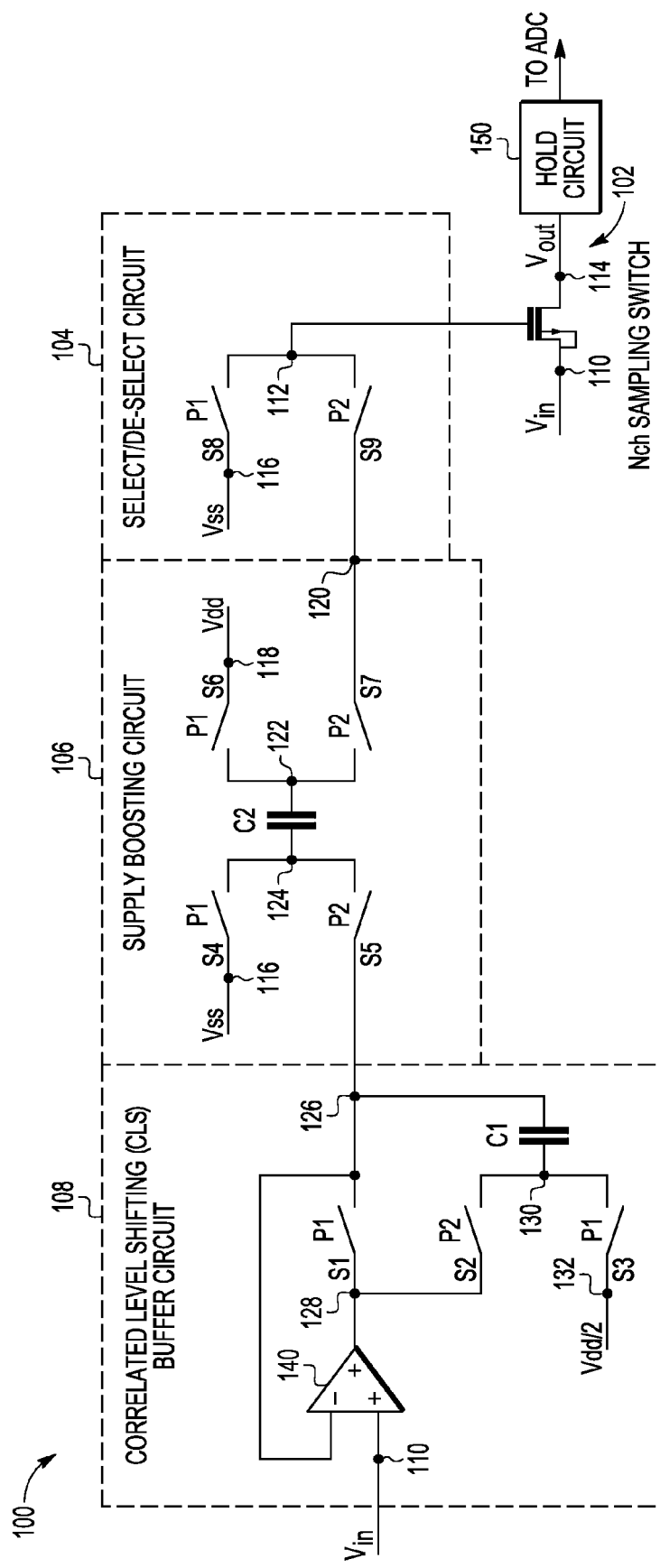
FIG. 1 is a circuit diagram illustrating a sampling switch circuit that uses correlated level shifting, in accordance with an embodiment.

The present invention is illustrated by way of example, and it's not limited by the accompanying figures, in which like references indicate similar elements. Skilled artisans will appreciate that elements in the figures are illustrated for simplicity and clarity and have not necessarily been drawn to scale. For example, the dimensions of some of the elements in the figures may be exaggerated relative to other elements to help improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

In accordance with an embodiment is a sampling switch circuit that uses correlated level shifting. The sampling switch circuit includes: a sampling switch having a first terminal, a control terminal, and an output terminal, wherein the first terminal is connected to an input voltage node; a boosting circuit connected to first and second supply voltage nodes and coupled to the control terminal of the sampling switch; and a correlated level shifting buffer circuit. The correlated level shifting buffer circuit includes: an amplifier having first and second inputs and an output, wherein the first input is connected to the input voltage node, and the output and second input are coupled to the boosting circuit; and a level shifting capacitor coupled to the second input and the output of the amplifier, to the boosting circuit, and to a level shifting voltage node.

In an embodiment, when an input voltage is connected to the input voltage node; a first supply voltage is connected to the first supply voltage node; a second supply voltage is connected to the second supply voltage node; and a level shifting voltage is connected to the level shifting voltage node, the sampling switch circuit is configured to generate, using only one hold phase and one tracking phase, a sampling signal at the control terminal of the sampling switch, wherein the sampling signal comprises a portion that is equal to the input voltage plus a difference between the first and second supply voltages. More particularly, the amplifier is configured to generate an amplifier output voltage at the output of the amplifier; and the level shifting capacitor is configured to level shift the amplifier output voltage based on the level shifting voltage to generate the portion of the sampling signal that is equal to the input voltage.

For the sake of brevity, conventional techniques related to switched capacitor circuits, ADC architectures, sample and hold circuits, digital logic circuits, and other functional aspects of the system (and the individual system operating components) may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment. In addition, for ease of discussion, where the figures illustrate example, single-ended implementations, those skilled in the art can adapt illustrated techniques for use in differential signaling applications using the provided guidelines without departing from the scope of the present disclosure.

FIG. 1 is a circuit diagram illustrating a sampling switch circuit 100 that uses correlated level shifting in accordance with an embodiment. As referred to herein, correlated level shifting is a technique that uses a capacitor (termed herein as a "correlated level shifting capacitor") at the output of an amplifier to eliminate distortion from the amplifier caused by finite amplifier gain. The sampling switch circuit 100 includes a sampling switch 102, a select/de-select circuit 104, a supply boosting circuit (also referred to herein simply as a boosting circuit) 106, and a correlated level shifting (CLS) buffer circuit 108. When implemented as a sample and hold circuit, the sampling switch circuit 100 further includes a hold circuit 150 (comprising a capacitor for instance) coupled to an output of the sampling switch 102, wherein an output of the hold circuit 150 is provided to additional circuitry (not shown), such as an ADC.

The sampling switch 102 is implemented using at least one transistor. In this embodiment, the sampling switch 102 comprises a single transistor having: a first terminal (also referred to herein as an input terminal), which in this case is a source terminal of the transistor, connected to a voltage input node 110. The voltage input node 110 is, in turn, connected to an analog (i.e., time varying) input voltage (Vin) during operation, which, for instance, is periodically sampled by the sampling switch circuit 100. The input voltage varies over time between (i.e., ranges from) a maximum input voltage level (i.e., a maximum magnitude or value) to a minimum input voltage level (i.e., a minimum magnitude or value). The sampling switch 102 further includes a control terminal connected to a node 112 and an output terminal connected to a node 114. The sampling switch 102 can be implemented using any suitable transistor technology, such as MOSFET (metal-oxide semiconductor field effect transistor) technology or bipolar technology. In this described embodiment, the sampling switch 102 comprises an N-channel MOSFET. However, in alternative embodiments, the sampling switch 102 comprises a P-channel MOSFET or both N-channel and P-channel MOSFETs coupled in parallel. As used herein, a control terminal for a switch is the terminal that controls turning the switch on or off, when the appropriate signal is applied to the control terminal. In the case of MOSFET switches, for example, the control terminal is a gate terminal, such as the gate terminal of the sampling switch 102, which is connected to node 112. For bipolar switches, the control terminal is a base terminal.

The correlated level shifting buffer circuit 108 includes an amplifier 140 having first and second inputs and an output, wherein the first input of the amplifier is a non-inverting input and the second input of the amplifier is an inverting input. The correlated level shifting buffer circuit 108 further includes first, second, and third switches (S1, S2, and S3) and a level shifting capacitor C1 that performs correlated level shifting (also referred to herein simply as level shifting) at the output of the amplifier 140. The level shifting capacitor C1 and the first, second and third switches (S1, S2, and S3) each have first and second terminals. The connectivity of the elements of correlated level shifting buffer circuit 108 is as follows.

The first (e.g., non-inverting) input of the amplifier 140 is connected to the voltage input node 110, which during operation is connected to the voltage input. The first terminal of the first switch (S1) is connected to the output of the amplifier 140 and to the first terminal of the second switch (S2), at a node 128. The second terminal of the first switch (S1) is connected to the second (e.g., inverting) input of the amplifier 140, to the second terminal (i.e., output terminal) of the level shifting capacitor C1, and to the boosting circuit 106, at a node 126. However, in an alternate circuit arrangement, the second terminal of the level shifting capacitor C1, at the node 126, is coupled to the inverting input of the amplifier 140 through at least one other circuit element, such as a resistor. The second terminal of the second switch (S2) is connected to the first terminal (i.e., input terminal) of the level shifting capacitor C1 and to the second terminal of the third switch (S3), at a node 130. The first terminal of the third switch (S3) is connected to a level shifting voltage node 132. During operation, the level shifting voltage node 132 is connected to a level shifting voltage that the level shifting capacitor C1 uses to perform the correlated level shifting. In this embodiment, the level shifting voltage has a value that is one half of an upper supply voltage rail (or Vdd/2), wherein the upper supply voltage rail (Vdd) is the maximum input voltage level of the input voltage.

In this embodiment, the boosting circuit 106 includes a single boosting capacitor C2 and four switches S4, S5, S6, and S7, each having first and second terminals. However, in alternative circuit arrangements, the boosting circuit can be implemented using more complex circuit topologies. In general, the first terminal (i.e., input terminal) of the boosting capacitor C2 is coupled (via the switch S4) to a first voltage supply node 116 and is further coupled (via the switch S5) to the second terminal of the level shifting capacitor C1, the second terminal of the first switch (S1) and the second input of the amplifier 140, at the node 126. More particularly, the first terminal of switch S5 is connected to the CLS buffer circuit 108 at the node 126, and the second terminal of switch S5 is connected to the first terminal of the boosting capacitor C2 and to the second terminal of switch S4, at a node 124. The first terminal of switch S4 is connected to the first supply voltage node 116.

Moreover, in general, the second terminal (i.e., output terminal) of the boosting capacitor C2 is coupled (via the switch S6) to a second supply voltage node 118 and is further coupled (via the switch S7 and the select/de-select circuit 104) to the gate terminal of the sampling switch 102. More particularly, the first terminal of switch S6 is connected to the second terminal of the boosting capacitor C2 and to the first terminal of the switch S7, at a node 122. The second terminal of switch S6 is connected to the second supply voltage node 118. The second terminal of the switch S7 is connected to the select/de-select circuit 104, at a node 120.

During operation, a first supply voltage is connected to the first supply voltage node 116. In this embodiment, the first supply voltage has a value equal to a lower supply voltage rail, or Vss, wherein the lower supply voltage rail (Vss) is the minimum input voltage level of the input voltage, which in this case is 0V. During operation, a second supply voltage is connected to the second supply voltage node 118. In this embodiment, the second supply voltage has a value equal to the upper supply voltage rail, or Vdd, wherein the upper supply voltage rail (Vdd) is the maximum input voltage level of the input voltage.

The select/de-select circuit 104 couples the sampling switch 102 to the boosting circuit 106. More particularly, the select/de-select circuit 104 includes switches S8 and S9, each having first and second terminals. The first terminal of switch S8 is connected to the first supply voltage node 116 (which is connected to the lower supply voltage rail Vss); and the second terminal of the switch S8 is connected to the second terminal of the switch S9 and to the gate terminal of the sampling switch 102 at a node 112. The first terminal of the switch S9 is connected to the boosting circuit 106 at the node 120.

The switches S1-S9 are further labeled with respective clock signals P1 and P2 that control the opening and closing of these switches. Switches labeled with P1 are controlled to close during a high phase of the P1 clock signal and are controlled to open when the P1 clock signal is low. Similarly, switches labeled with P2 are controlled to close during a high phase of the P2 clock signal and are controlled to open when the P2 clock signal is low. As used herein, a first clock phase (also referred to herein as a hold phase when sampling switch 102 is OFF and Vout is in a hold mode) is a high phase of the P1 clock signal, which closes the switches (e.g., S1, S3, S4, S6, and S8) labeled with P1. During the first clock phase, the other switches (S2, S5, S7, and S9) are open. Moreover, as used herein, a second and next clock phase (also referred to herein as a tracking phase when sampling switch 102 is ON and Vout is tracking Vin) is the very next high phase of the P2 clock signal that occurs after the P1 clock signal (i.e., the first clock phase) goes low. This next clock phase closes the switches (e.g., S2, S5, S7, and S9) labeled with P2. During the second clock phase, the other switches (S1, S3, S4, S6, and S8) are open. The sampling switch circuit 100 operates as follows during the first (hold) and second (tracking) phases.

During the first clock phase, the amplifier 140 is configured to generate an amplifier output voltage, based on the input voltage Vin, at the output of the amplifier at the node 128. More particularly, since the non-inverting input is connected to the input voltage, and the inverting input is connected to the output of the amplifier 140, the amplifier 140 is configured to have an ideal gain of one (1) at all voltage levels to facilitate the amplifier output voltage having an equal magnitude as the input voltage at the output of the amplifier 140. However, the gain of the amplifier 140 is not ideal for all input voltage levels but is affected by distortion in the amplifier 140. This distortion causes the amplifier 140 to clip input voltages having a magnitude within V_sat of the maximum or minimum voltage levels of the input voltage, wherein V_sat is a saturation voltage of the one or more transistors that comprise the amplifier 140 and is also referred to herein as the amplifier overhead. Accordingly, the amplifier output voltage maxes out to within V_sat of the maximum or minimum voltage levels of the input voltage, and therefore does not track the input voltage beyond these magnitudes.

Furthermore during the first clock phase, the level shifting capacitor C1 is configured to charge to the level shifting voltage (Vdd/2) at the first terminal of the level shifting capacitor and to charge to the amplifier output voltage at the second terminal of the level shifting capacitor; and the boosting capacitor C2 is configured to charge to the first supply voltage (Vss) at the first terminal of the boosting capacitor and to charge to the second supply voltage (Vdd) at the second terminal of the boosting capacitor. More specifically, during the high phase of P1, switches S1 and S3 close to, respectively, connect the amplifier output voltage at node 128 to the second terminal of the level shifting capacitor C1 and to connect the level shifting voltage Vdd/2 to the first terminal of level shifting capacitor C1, thereby charging its terminals as described above by the end of the first clock phase, and, thereby, creating (or storing) a voltage difference between the level shifting voltage and the amplifier output voltage across the terminals of the level shifting capacitor C1. Moreover, during the high phase of P1, switches S4 and S6 close to, respectively, connect Vss to the first terminal of the boosting capacitor C2 and to connect Vdd to the second terminal of boosting capacitor C2, thereby charging its terminals as described above by the end of the first clock phase, and, thereby, creating (or storing) a voltage difference between Vdd and Vss across the terminals of the boosting capacitor C2. Finally, during the high phase of P1, switch S8 closes to connect the gate terminal of the sampling switch 102 to Vss, turning the sampling switch 102 OFF and maintaining the switch in the OFF position or mode during the first clock phase.

During the second and next clock phase (i.e., the next high phase of P2) and when the input voltage is, for instance, at or near (meaning less than V_sat from) the upper or lower supply voltage rail, the level shifting capacitor C1 is configured to level shift the amplifier output voltage at the node 128 based on the level shifting voltage (Vdd/2) to generate a voltage level equal to the input voltage at the second terminal of the level shifting capacitor C1. The boosting capacitor C2 is configured to generate a sampling signal at the second terminal of the boosting capacitor, wherein the sampling signal is equal to the voltage level at the second terminal of the level shifting capacitor C1 plus a difference between the first (Vss) and second (Vdd) supply voltages. More particularly, during the high phase of P2, the correlated level shifting function is as follows. Switch S2 closes to connect the level shifting capacitor C1 in series with the output of the amplifier 140, which instantaneously drives the output terminal (at node 126) of the level shifting capacitor C1 to Vin, which is at or near the supply voltage rail, plus Vdd/2 minus the amplifier overhead minus the charge needed to drive the switch S1. The resulting voltage, at the output terminal of the level shifting capacitor C2, is typically much larger than the supply voltage rail, resulting in a voltage spike. This voltage spike is typically short lived due to the feedback around the amplifier 140, which quickly drives the input terminal (at node 130) of the level shifting capacitor C1 and the output of the amplifier 140 at node 128 lower until the output terminal of the level shifting capacitor C1 reaches the value of the input voltage, which in this case is at or near the supply voltage rail.

Figure 3:
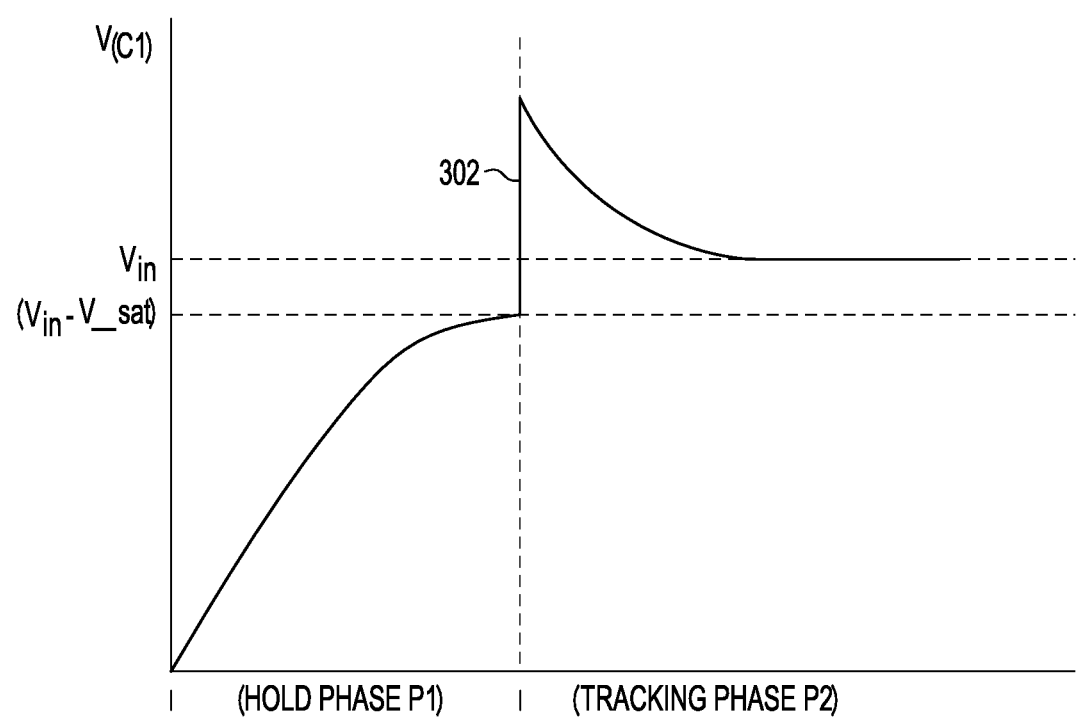
FIG. 3 is a diagram depicting the voltage at an output terminal of a level shifting capacitor within a correlated level shifting buffer circuit of a sampling switch circuit, in accordance with an embodiment.

Turning momentarily to FIG. 3, a diagram 300 is shown depicting the voltage at the output terminal (at node 126) of the level shifting capacitor C1 during the first and second clock phases and when the input voltage is at the maximum or minimum input voltage level, in accordance with an embodiment. As can be seen, during the hold phase (the first clock phase), the output terminal of C1 charges to a first voltage level comprising a difference between the input voltage level and the overhead of the amplifier 140, i.e. about (Vin-V_sat), which is in effect an estimate of the value of the input voltage at the maximum or minimum input voltage levels. At the beginning of the tracking phase (the second clock phase), the output terminal of C1 charges to a second voltage level comprising a sum of the first voltage level and the level shifting voltage, which is termed herein as a voltage spike 302. Further during the tracking phase, the voltage spike 302 that occurs on the output terminal of C1 is followed by the value of the voltage on the output terminal of C1 settling to the value of the input voltage Vin, which in this case is the supply voltage rail. Thus, even at the maximum and minimum input voltage levels, the voltage at the output terminal of C1 tracks the input voltage.

Turning back to the operation of circuit 100 during the high phase of P2, switches S5, S7, and S9 close to, respectively, connect the first terminal of the boosting capacitor C2 in series with the output terminal of the level shifting capacitor C1 and to connect the second terminal of the boosting capacitor C2 to the gate of the N-channel sampling switch 102. This raises the first terminal of the boosting capacitor C2 from ground, Vss, to the input voltage level and the second terminal of the boosting capacitor to Vdd plus the input voltage level, which is the sampling signal applied to the N-channel switch 102. The sampling signal turns the sampling switch 102 ON. Due to the level shifting performed by the level shifting capacitor C1, the voltage level generated at the second terminal of the level shifting capacitor C1 ranges from the maximum input voltage level to the minimum input voltage level. Accordingly, the boosting circuit 106 is configured to generate a constant (i.e., the same) voltage difference between the first terminal and the gate terminal of the sampling switch 102 during the second clock phase when the sampling switch 102 is on, at any input voltage from the maximum input voltage level to the minimum input voltage level, because the level shifting capacitor C1 tracks the input voltage being received into the sampling switch 102 at any input voltage.

Figure 2:
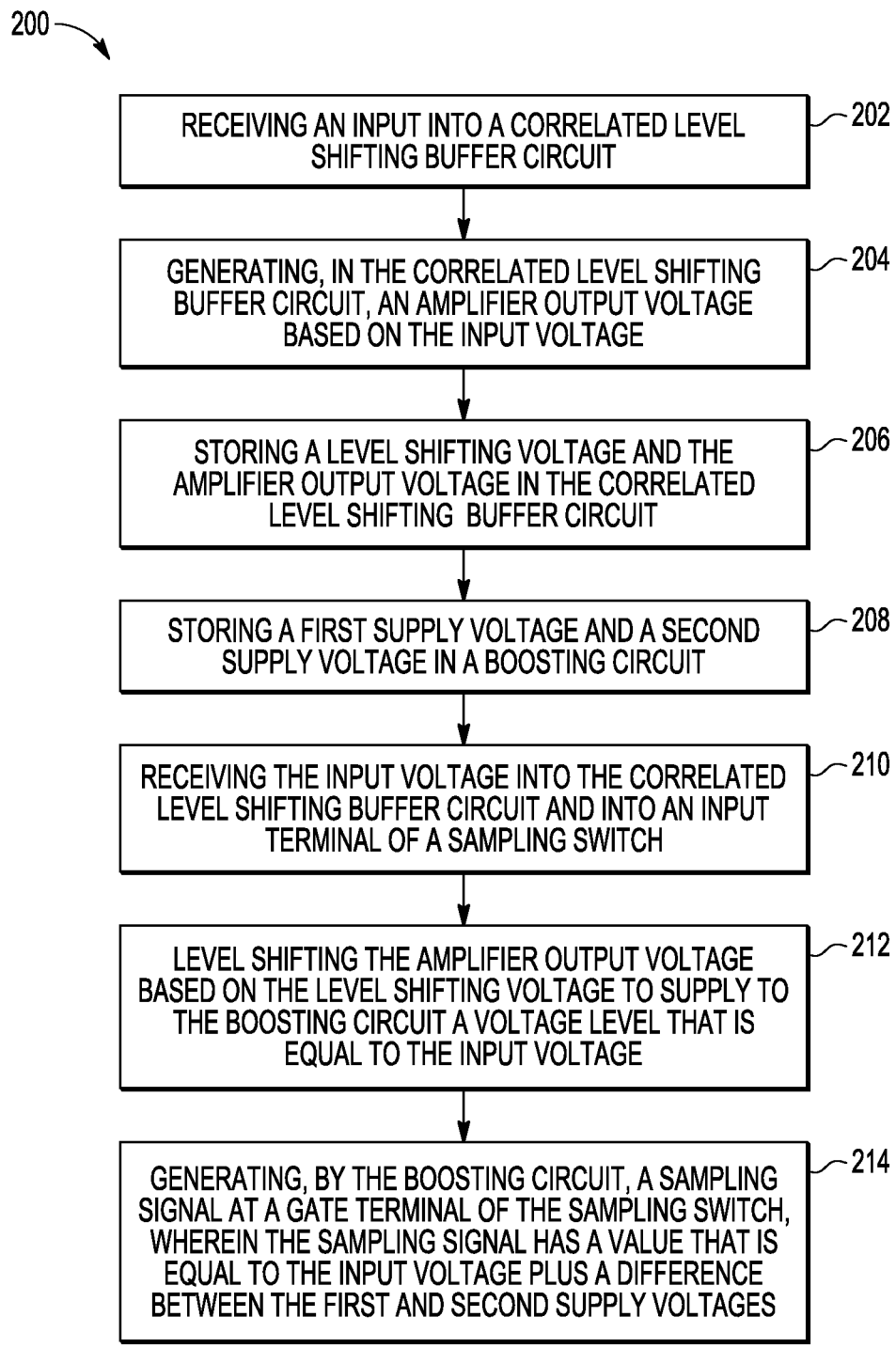
FIG. 2 is a flow diagram illustrating a method for using correlated level shifting in a sampling switch circuit, in accordance with an embodiment.

Turning now to FIG. 2, shown therein is a flow diagram 200 illustrating a method for using correlated level shifting in a sampling switch circuit such as the sampling switch circuit 100. Functions 202 to 208 occur during the first clock phase (of P1). Functions 210 to 214 occur during the next clock phase (of P2). At 202, a correlated level shifting buffer circuit (e.g., 108) receives the input voltage Vin, which can be at the maximum or minimum input voltage level. At 204, the correlated level shifting buffer circuit generates an amplifier output voltage based on the input voltage, wherein the amplifier output voltage is equal to the value of Vin except for values within V_sat of Vin.

At 206, the correlated level shifting buffer circuit stores a level shifting voltage (e.g., Vdd/2) and the amplifier output voltage. More particularly, storing the level shifting voltage and the amplifier output voltage in the correlated level shifting buffer circuit comprises charging a first terminal of a level shifting capacitor (e.g., C1) to the level shifting voltage and charging a second terminal of the level shifting capacitor to the amplifier output voltage. Another way of stating this is that at 206, the correlated level shifting buffer circuit stores a difference between the level shifting voltage and the amplifier output voltage across the terminals of the level shifting capacitor C1. Moreover, at 206 when the input voltage is at or near the maximum or the minimum input voltage level, during the first clock phase, the second terminal of the level shifting capacitor is charged to a first voltage level comprising a difference between the input voltage level (the maximum or minimum input voltage level) and an overhead of the amplifier that generates the amplifier output voltage.

At 208, a boosting circuit (e.g., 106) stores a first supply voltage (e.g., Vss) and a second supply voltage (e.g., Vdd). In the circuit arrangement 100, storing the first supply voltage and the second supply voltage in the boosting circuit comprises charging a first terminal of a single boosting capacitor (e.g., C2) of the boosting circuit to the first supply voltage and charging a second terminal of the single boosting capacitor to the second supply voltage. Another way of stating this is that at 208, the boosting circuit stores a voltage difference between the first and second supply voltages across the terminals of the boosting capacitor C2.

During the second and next clock phase, at 210, the input voltage is received into the correlated level shifting buffer circuit and into an input terminal (e.g., at node 110) of a sampling switch (e.g., 102). The amplifier output voltage is level shifted (at 212) based on the level shifting voltage to supply to the boosting circuit a voltage level that is equal to the input voltage. The voltage level supplied to the boosting circuit is equal to the input voltage received into the correlated level shifting buffer circuit and the sampling switch during the second clock phase. The input voltage during the second clock phase ranges from the maximum input voltage level to the minimum input voltage level. More particularly, at a beginning of the second clock phase, the second terminal of the level shifting capacitor is charged to a second voltage level comprising a sum of the first voltage level (i.e., the difference between the input voltage level and the amplifier overhead) and the level shifting voltage, wherein the second voltage level settles to the input voltage level during the second clock phase. Accordingly, level shifting the amplifier output voltage based on the level shifting voltage comprises tracking, at the second terminal of the level shifting capacitor, the input voltage at any input voltage from the maximum input voltage level to the minimum input voltage level.

At 214, the boosting circuit generates a sampling signal at a control (i.e., gate) terminal of the sampling switch, wherein the sampling signal has a value that is equal to the input voltage plus a difference between the first and second supply voltages. The sampling signal turns on the sampling switch to allow the input voltage to pass from the input terminal to an output terminal (e.g., at node 114) of the sampling switch. The sampling signal is generated at the second terminal of the boosting capacitor. Moreover, during the second clock phase, the sampling signal generates a constant voltage difference (e.g., Vgs) between the input terminal and the control terminal of the sampling switch, at any input voltage from the maximum input voltage level to the minimum input voltage level.

Thus, in one embodiment, a sampling switch circuit that includes a sampling switch, a boosting circuit, and a buffer circuit, implemented in accordance with the present teachings, performs correlated level shifting on the output of an amplifier in the buffer circuit using only two clock phases, a hold phase and a tracking phase. An example benefit of this embodiment is the provision of a sampling switch circuit that minimizes distortion in the sampling switch by maintaining a constant voltage difference (e.g., Vgs) across the input and control terminals of the sampling switch transistor at any input voltage level, even at the maximum and minimum input voltage levels (also referred to herein as the supply voltage rails).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

As used herein, the term "configured to", "configured with", "arranged to", "arranged with", "capable of" and any like or similar terms means that referenced circuit elements have an internal physical arrangement (such as by virtue of a particular transistor technology used) and/or physical coupling and/or connectivity with other circuit elements in an inactive state. This physical arrangement and/or physical coupling and/or connectivity (while in the inactive state) enables the circuit elements to perform stated functionality while in the active state of receiving and processing various signals at inputs of the circuit elements to generate signals at the output of the circuit elements.

As further used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The above description refers to nodes or features being "connected" or "coupled" together. As used here and, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment (assuming that the functionality of the given circuit is not adversely affected).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A sampling switch circuit that uses correlated level shifting, the sampling switch circuit comprising:
    a sampling switch having a first terminal, a control terminal, and an output terminal, wherein the first terminal is connected to an input voltage node;
    a boosting circuit connected to first and second supply voltage nodes and coupled to the control terminal of the sampling switch;
    a correlated level shifting buffer circuit comprising:
        an amplifier having first and second inputs and an output, wherein the first input is connected to the input voltage node, and the output and second input are coupled to the boosting circuit; and
        a level shifting capacitor coupled to the second input and output of the amplifier, to the boosting circuit, and to a level shifting voltage node;
    wherein when an input voltage is connected to the input voltage node, a first supply voltage is connected to the first supply voltage node, and a second supply voltage is connected to the second supply voltage node, the sampling switch circuit is configured to generate, using only one estimate phase and one level shift phase, a sampling signal at the control terminal of the sampling switch, wherein the sampling signal comprises a portion that is equal to the input voltage plus a difference between the first and second supply voltages.

2. The sampling switch circuit of claim 1, wherein when a level shifting voltage is connected to the level shifting voltage node:
    the amplifier is configured to generate an amplifier output voltage at the output of the amplifier;
    the level shifting capacitor is configured to level shift the amplifier output voltage based on the level shifting voltage to generate the portion of the sampling signal that is equal to the input voltage.

3. The sampling switch circuit of claim 1, wherein the correlated level shifting buffer circuit further comprises first, second, and third switches, wherein the level shifting capacitor and the first, second and third switches each have first and second terminals, and wherein:
    the first terminal of the first switch is connected to the output of the amplifier and to the first terminal of the second switch;
    the second terminal of the first switch is connected to the second input of the amplifier, to the second terminal of the level shifting capacitor, and to the boosting circuit;
    the second terminal of the second switch is connected to the first terminal of the level shifting capacitor and to the second terminal of the third switch; and
    the first terminal of the third switch is connected to the level shifting voltage node.

4. The sampling switch circuit of claim 3, wherein the first input of the amplifier comprises a non-inverting input, and the second input of the amplifier comprises an inverting input.

5. The sampling switch circuit of claim 3, wherein the boosting circuit comprises a single boosting capacitor having first and second terminals, and wherein:
    the first terminal of the boosting capacitor is coupled to the first voltage supply node, the second terminal of the level shifting capacitor, the second terminal of the first switch and the second input of the amplifier; and the second terminal of the boosting capacitor is coupled to the second supply voltage node and to the control terminal of the sampling switch.

6. The sampling switch circuit of claim 5, wherein when a level shifting voltage is connected to the level shifting voltage node, an input voltage is connected to the input voltage node, a first supply voltage is connected to the first supply voltage node, and a second supply voltage is connected to the second supply voltage node:

during a first clock phase, the amplifier is configured to generate an amplifier output voltage at the output of the amplifier, the level shifting capacitor is configured to charge to the level shifting voltage at the first terminal of the level shifting capacitor and to charge to the amplifier output voltage at the second terminal of the level shifting capacitor, and the boosting capacitor is configured to charge to the first supply voltage at the first terminal of the boosting capacitor and to charge to the second supply voltage at the second terminal of the boosting capacitor; and during a second and next clock phase, the level shifting capacitor is configured to level shift the amplifier output voltage based on the level shifting voltage to generate a voltage level equal to the input voltage at the second terminal of the level shifting capacitor, and the boosting capacitor is configured to generate a sampling signal at the second terminal of the boosting capacitor, wherein the sampling signal is equal to the voltage level at the second terminal of the level shifting capacitor plus a difference between the first and second supply voltages.

7. The sampling switch circuit of claim 6, wherein when the input voltage ranges from a maximum input voltage level to a minimum input voltage level, the voltage level generated at the second terminal of the level shifting capacitor ranges from the maximum input voltage level to the minimum input voltage level.

8. The sampling switch circuit of claim 7, wherein the level shifting voltage is one half the maximum input voltage level.

9. The sampling switch circuit of claim 7, wherein the boosting circuit is configured to generate a constant voltage difference between the first terminal and the control terminal of the sampling switch during the second clock phase, at any input voltage from the maximum input voltage level to the minimum input voltage level.

10. The sampling switch circuit of claim 3, wherein the sampling switch comprises an N-channel metal oxide semiconductor field effect transistor.

11. A method for using correlated level shifting in a sampling switch circuit, the method comprising:

during a first clock phase:
receiving an input voltage into a correlated level shifting buffer circuit;
generating, in the correlated level shifting buffer circuit, an amplifier output voltage based on the input voltage;
storing a level shifting voltage and the amplifier output voltage in the correlated level shifting buffer circuit;
storing a first supply voltage and a second supply voltage in a boosting circuit;

during a second and next clock phase:
receiving the input voltage into the correlated level shifting buffer circuit and into an input terminal of a sampling switch;
level shifting the amplifier output voltage based on the level shifting voltage to supply to the boosting circuit a voltage level that is equal to the input voltage;
generating, by the boosting circuit, a sampling signal at a control terminal of the sampling switch, wherein the sampling signal has a value that is equal to the input voltage plus a difference between the first and second supply voltages, wherein the sampling signal turns on the sampling switch to allow the input voltage to pass from the input terminal to an output terminal of the sampling switch.

12. The method of claim 11, wherein storing the level shifting voltage and the amplifier output voltage in the correlated level shifting buffer circuit comprises charging a first terminal of a level shifting capacitor to the level shifting voltage and charging a second terminal of the level shifting capacitor to the amplifier output voltage.

13. The method of claim 12, wherein storing the first supply voltage and the second supply voltage in the boosting circuit comprised charging a first terminal of a single boosting capacitor of the boosting circuit to the first supply voltage and charging a second terminal of the single boosting capacitor to the second supply voltage.

14. The method of claim 13, wherein the sampling signal is generated at the second terminal of the boosting capacitor.

15. The method of claim 12, wherein the input voltage during the second clock phase ranges from a maximum input voltage level to a minimum input voltage level, and wherein level shifting the amplifier output voltage based on the level shifting voltage comprises tracking, at the second terminal of the level shifting capacitor, the input voltage at any input voltage from the maximum input voltage level to the minimum input voltage level.

16. The method of claim 15, wherein the voltage level supplied to the boosting circuit is equal to the input voltage received into the correlated level shifting buffer circuit and the sampling switch during the second clock phase.

17. The method of claim 16, wherein during the second clock phase, the sampling signal generates a constant voltage difference between the input terminal and the control terminal of the sampling switch, at any input voltage from the maximum input voltage level to the minimum input voltage level.

18. The method of claim 15, wherein when the input voltage is at or near the maximum or the minimum input voltage level, the method further comprising, during the first clock phase, charging the second terminal of the level shifting capacitor to a first voltage level comprising a difference between the input voltage level and an overhead of an amplifier that generates the amplifier output voltage.

19. The method of claim 15 further comprising, at a beginning of the second clock phase, charging the second terminal of the level shifting capacitor to a second voltage level comprising a sum of the first voltage level and the level shifting voltage, wherein the second voltage level settles to the input voltage level during the second clock phase.

* * * * *